United States Patent
Gim

(10) Patent No.: US 10,629,275 B2
(45) Date of Patent: Apr. 21, 2020

(54) DATA STORAGE DEVICE AND OPERATING METHOD THEREOF

(71) Applicant: SK hynix Inc., Gyeonggi-do (KR)

(72) Inventor: Yeong Dong Gim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 62 days.

(21) Appl. No.: 15/952,949

(22) Filed: Apr. 13, 2018

(65) Prior Publication Data

US 2019/0096493 A1   Mar. 28, 2019

(30) Foreign Application Priority Data

Sep. 26, 2017  (KR) .......................... 10-2017-0124313

(51) Int. Cl.
| | | |
|---|---|---|
| G11C 11/00 | (2006.01) | |
| G11C 16/34 | (2006.01) | |
| G11C 29/52 | (2006.01) | |
| G06F 11/10 | (2006.01) | |
| G11C 11/56 | (2006.01) | |
| G11C 16/14 | (2006.01) | |
| G11C 16/26 | (2006.01) | |

(52) U.S. Cl.
CPC ...... *G11C 16/3445* (2013.01); *G06F 11/1048* (2013.01); *G06F 11/1068* (2013.01); *G11C 11/5635* (2013.01); *G11C 16/14* (2013.01); *G11C 29/52* (2013.01); *G11C 11/56* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 5,297,096 A | * | 3/1994 | Terada | ............ G11C 16/16 365/185.06 |
| 8,365,030 B1 | * | 1/2013 | Choi | ............ G06F 11/1048 714/746 |
| 9,390,808 B1 | | 7/2016 | Kato | |
| 2001/0015932 A1 | * | 8/2001 | Akaogi | ............ G11C 5/145 365/230.03 |
| 2006/0221730 A1 | * | 10/2006 | Park | ............ G11C 17/165 365/200 |
| 2007/0121388 A1 | * | 5/2007 | Lee | ............ G11C 16/16 365/185.29 |

(Continued)

FOREIGN PATENT DOCUMENTS

KR          101512927          4/2015

*Primary Examiner* — Daniel F. McMahon
(74) *Attorney, Agent, or Firm* — IP & T Group LLP

(57) ABSTRACT

A data storage device includes a nonvolatile memory device including a plurality of memory cells; and a controller suitable for determining whether the memory cells are erased or not, wherein, when it is determined, based on first data read as a read voltage set including a first read voltage is applied to the memory cells, that the memory cells are not erased, the controller determines whether the memory cells are erased or not based on second data read as the read voltage set in which the first read voltage is replaced with a second read voltage is applied to the memory cells, and wherein the first and second read voltages are read voltages of lowest levels among read voltages included in the read voltage set.

20 Claims, 12 Drawing Sheets

(56) References Cited

U.S. PATENT DOCUMENTS

| | | | |
|---|---|---|---|
| 2009/0310405 A1* | 12/2009 | Lee | G11C 16/08 |
| | | | 365/185.2 |
| 2011/0051524 A1* | 3/2011 | Hsu | G11C 11/5628 |
| | | | 365/185.22 |
| 2014/0347935 A1* | 11/2014 | Kim | G11C 11/5642 |
| | | | 365/185.17 |
| 2015/0262691 A1* | 9/2015 | Kamata | G11C 16/26 |
| | | | 365/185.22 |

* cited by examiner

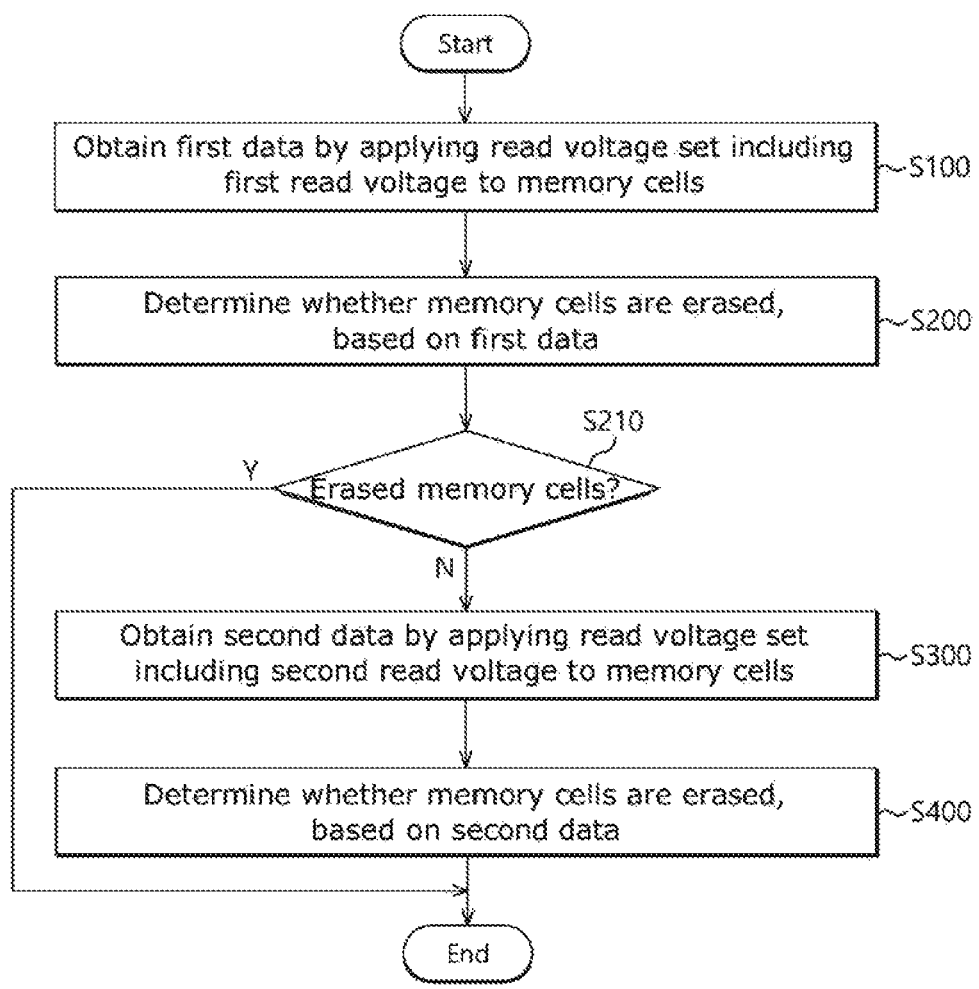

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0124313, filed on Sep. 26, 2017, in the Korean Intellectual Property Office, which is incorporated herein by reference in its entirety.

BACKGROUND

1. Technical Field

Various embodiments of the present disclosure generally relate to a data storage device. Particularly, the embodiments relate to a data storage device including a nonvolatile memory device.

2. Related Art

A data storage device may be configured to store the data provided from an external device, in response to a write request from the external device. Also, the data storage device may be configured to provide stored data to the external device, in response to a read request from the external device. The external device may be an electronic device capable of processing data such as a computer, a digital camera or a mobile phone. The data storage device may be built in the external device, or may be manufactured in a detachable form and coupled to the external device.

A data storage device using a memory device has advantages of stability and durability because there is no mechanical driving part, and information access speed is high and power consumption is low. Data storage devices having such advantages include a universal serial bus (USB) memory device, memory cards having various interfaces, a universal flash storage (UFS) device, and a solid state drive (SSD).

SUMMARY

Various embodiments are directed to a data storage device capable of determining with high accuracy whether memory cells are erased or not, and an operating method thereof.

In an embodiment, a data storage device may include: a nonvolatile memory device including a plurality of memory cells; and a controller suitable for determining whether the memory cells are erased or not, wherein, when it is determined, based on first data read as a read voltage set including a first read voltage is applied to the memory cells, that the memory cells are not erased, the controller determines whether the memory cells are erased or not based on second data read as the read voltage set in which the first read voltage is replaced with a second read voltage is applied to the memory cells, and wherein the first and second read voltages are read voltages of lowest levels among read voltages included in the read voltage set.

In an embodiment, a method for operating a data storage device may include: obtaining first data by applying a read voltage set including a first read voltage to memory cells; determining whether the memory cells are erased or not, based on the first data; obtaining second data by applying the read voltage set in which the first read voltage is replaced with a second read voltage, to the memory cells, when it is determined that the memory cells are not erased; and determining whether the memory cells are erased or not based on the second data, wherein the first and second read voltages are read voltages of lowest levels among read voltages included in the read voltage set.

In an embodiment, a method for operating a data storage device may include: determining whether memory cells are erased or not, based on first data obtained by applying a read voltage set including a first read voltage to the memory cells; performing an error correction operation for the first data, when it is determined as a result of the determining that the memory cells are not erased; obtaining second data by applying the read voltage set in which the first read voltage is replaced with a second read voltage, when the error correction operation fails; and determining whether the memory cells are erased or not, based on the second data, wherein the first and second read voltages are read voltages of lowest levels among read voltages included in the read voltage set.

In an embodiment, a method for operating a memory system may include: determining whether memory cells are erased based on a first data read with a first read voltage from the memory cells; and determining whether the memory cells are erased based on a second data read with a second read voltage from the memory cells when the memory cells are determined as not erased on the basis of the first data.

According to the embodiments, a data storage device may secure the stability of a flash translation layer (FTL) by determining whether memory cells are erased or not, with high accuracy.

BRIEF DESCRIPTION OF THE DRAWINGS

FIG. 5 is a flow chart explaining a method for operating a data storage device in accordance with an embodiment of the present disclosure.

DETAILED DESCRIPTION

Figure 1:
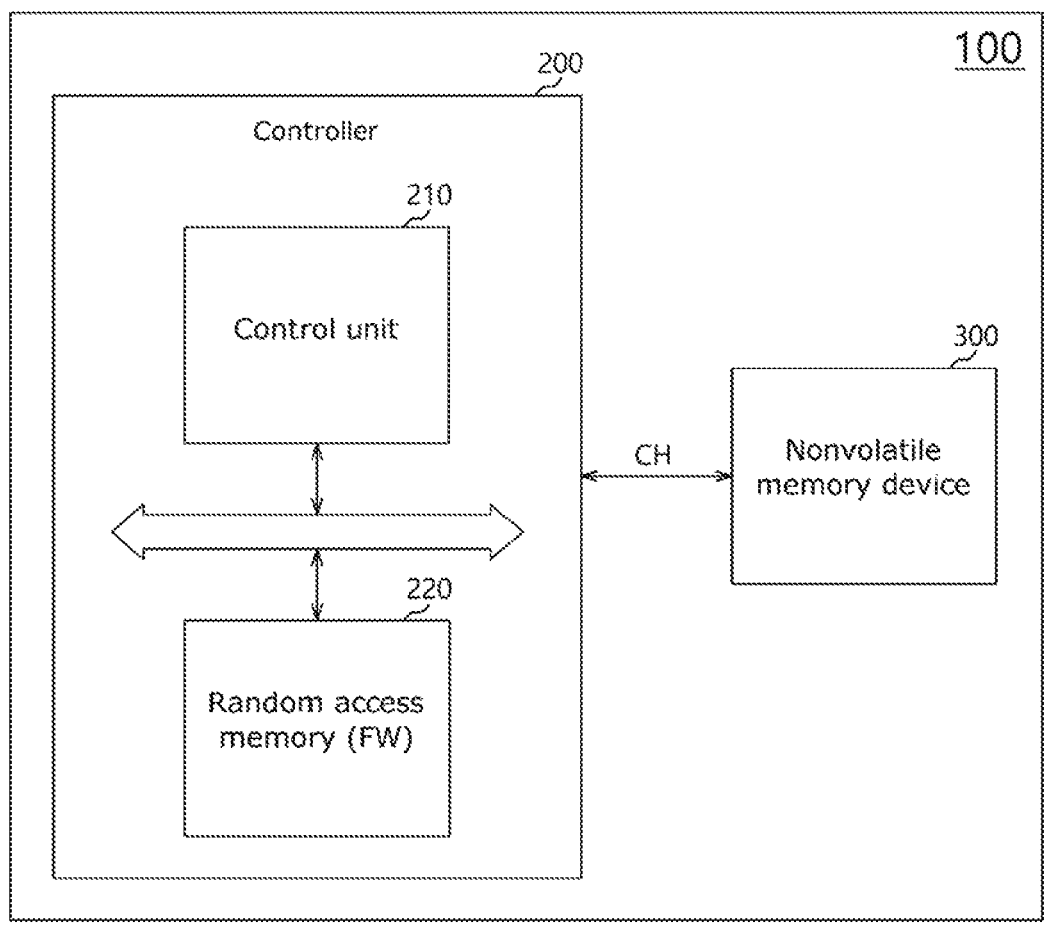
FIG. 1 is a block diagram illustrating an example of a data storage device in accordance with an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, a data storage device and an operating method thereof will be described below with reference to the accompanying drawings through various examples of embodiments.

FIG. 1 is a block diagram illustrating an example of a data storage device 100 in accordance with an embodiment of the present disclosure.

The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may be referred to as a memory system.

The data storage device 100 may be manufactured as any one of various kinds of storage devices according to a host interface meaning a transmission protocol with respect to the host device. For example, the data storage device 100 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the data storage device 100 may include a controller 200 and a nonvolatile memory device 300. The controller 200 may include a control unit 210 and a random access memory 220.

The control unit 210 may be configured by a micro control unit (MCU) or a central processing unit (CPU). The control unit 210 may process a request transmitted from the host device. In order to process the request, the control unit 210 may drive an instruction or algorithm of a code type, that is, a firmware FW, loaded in the random access memory 220, and may control internal function blocks and the nonvolatile memory device 300.

The random access memory 220 may be configured by a random access memory such as a dynamic random access memory (DRAM) or a static random access memory (SRAM). The random access memory 220 may store the firmware FW which is to be driven by the control unit 210. Also, the random access memory 220 may store data necessary for driving the firmware FW, for example, metadata. That is to say, the random access memory 220 may operate as the working memory of the control unit 210.

Figure 2A:
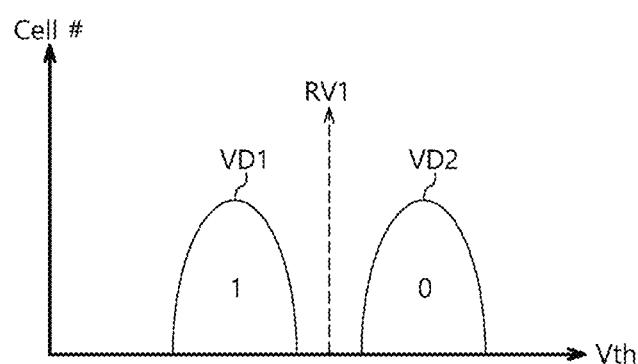
FIG. 2A is a diagram illustrating an example of threshold voltage distributions of SLC memory cells.
Figure 2B:
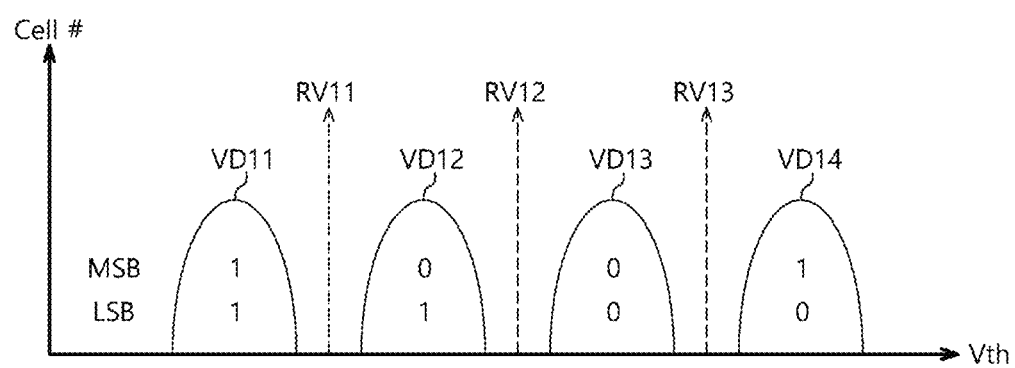
FIG. 2B is a diagram illustrating an example of threshold voltage distributions of MLC memory cells.

FIG. 2A is a diagram illustrating an example of threshold voltage distributions of single level cell (SLC) memory cells, and FIG. 2B is a diagram illustrating an example of threshold voltage distributions of multi-level cell (MLC) memory cells.

Referring to FIG. 2A, when 1-bit data is stored in each memory cell, a memory cell may be positioned in any one of threshold voltage distributions VD1 and VD2 depending on the data stored therein. When a write operation is performed, a memory cell may be controlled to be positioned in any one of the two threshold voltage distributions VD1 and VD2 depending on 1-bit data to be written. For example, a memory cell written with data "1" may have a threshold voltage corresponding to the threshold voltage distribution VD1. A memory cell written with data "0" may have a threshold voltage corresponding to the threshold voltage distribution VD2.

Referring to FIG. 2B, when 2-bit data is stored in each memory cell, a memory cell may be positioned in any one of threshold voltage distributions VD11 to VD14 depending on the data stored therein. When a write operation is performed, a memory cell may be controlled to be positioned in any one of the four threshold voltage distributions VD11 to VD14 depending on 2-bit data to be written. For example, a memory cell written with data "11" may have a threshold voltage corresponding to the threshold voltage distribution VD11. A memory cell written with data "10" may have a threshold voltage corresponding to the threshold voltage distribution VD12. A memory cell written with data "00" may have a threshold voltage corresponding to the threshold voltage distribution VD13. A memory cell written with data "01" may have a threshold voltage corresponding to the threshold voltage distribution VD14. According to the embodiment, the number of bits to be stored in each memory cell is not limited thereto. When k number of bits are stored in each memory cell, a memory cell may be positioned in any one among 2^k number of threshold voltage distributions depending on the data stored therein.

Memory cells coupled to a common word line may correspond to two pages, that is, a least significant bit (LSB) page and a most significant bit (MSB) page. A lower bit and an upper bit stored in each memory cell may be stored in the LSB page and the MSB page, respectively. That is to say, the LSB page is a region in which the lower bits of the memory cells coupled to the common word line are stored, and the MSB page is a region in which the upper bits of the memory cells coupled to the common word line are stored. When k number of bits are stored in each memory cell, memory cells coupled to a common word line may correspond to k number of pages.

When describing a read operation for a memory cell, the memory cell may be turned on or off depending on a threshold voltage, when a predetermined read voltage is applied through a word line. In detail, a memory cell may be turned on when a read voltage higher than its threshold voltage is applied, and may be turned off when a read voltage lower than its threshold voltage is applied. In this case, by sensing the current formed when a memory cell is turned on or off, it is possible to determine whether the threshold voltage of the memory cell is higher or lower than a read voltage. Thus, in the nonvolatile memory device 300, by applying a predetermined read voltage to memory cells, for example, data "1" may be read from a memory cell which has a threshold voltage lower than the read voltage, and for example, data "0" may be read from a memory cell which has a threshold voltage higher than the read voltage.

Referring again to FIG. 2A, the nonvolatile memory device 300 may read the data stored in memory cells by applying a read voltage RV1 positioned between the threshold voltage distributions VD1 and VD2 to the memory cells. For example, a memory cell positioned in the threshold voltage distribution VD1 may be turned on when the read voltage RV1 is applied, and data "1" may be read. A memory cell positioned in the threshold voltage distribution VD2 may be turned off when the read voltage RV1 is applied, and data "0" may be read.

Referring to FIG. 2B, the nonvolatile memory device 300 may read the data stored in memory cells by applying read voltages RV11 to RV13 positioned between the threshold voltage distributions VD11 to VD14 to the memory cells. For example, since a memory cell positioned in the threshold voltage distribution VD12 is turned off when the read voltage RV11 is applied and is turned on when the read voltage RV2 is applied, data "10" may be read based on these operations.

Figure 3A:
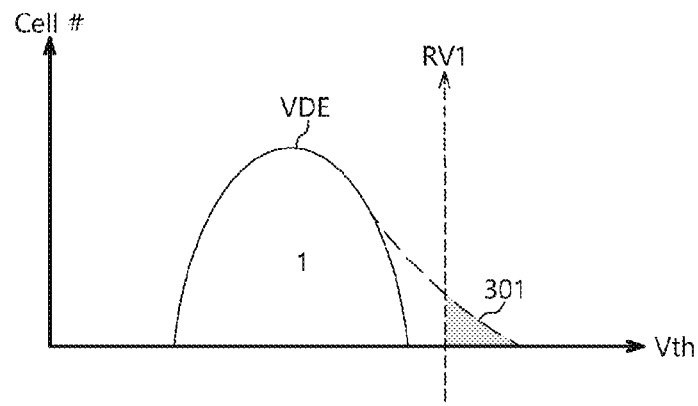
FIG. 3A is a diagram illustrating a case where erased memory cells coupled to a common word line are placed under an unstable state.
Figure 3B:
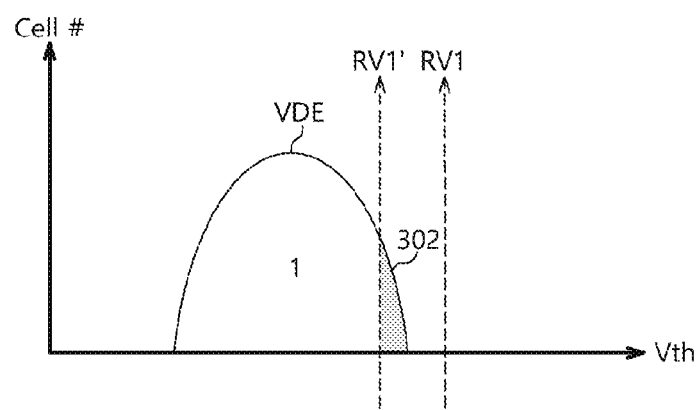
FIG. 3B is a diagram illustrating a case where memory cells are read by using a voltage other than an inputted read voltage.

FIG. 3A is a diagram illustrating a case where erased memory cells coupled to a common word line are placed under an unstable state, and FIG. 3B is a diagram a case where memory cells are read by using a voltage other than an inputted read voltage.

Referring to FIG. 3A, first, normally erased memory cells may form a threshold voltage distribution VDE. The normally erased memory cells may output "1" in response to a read voltage RV1.

Some memory cells among erased memory cells may be placed under an unstable state due to various reasons, and the threshold voltage distribution VDE may be formed to include the broadened section shown by a dotted line. The erased memory cells which are placed in a region 301, that is, unstable memory cells, may have threshold voltages higher than the read voltage RV1. The unstable memory cells may be placed under the unstable state by, for example, an incomplete erase operation. Also, if a sudden power-off occurs, the unstable memory cells may be placed under the unstable state by the influence of a disturbance. If a read operation is performed using the read voltage RV1, unstable memory cells may be turned off since they have threshold voltages higher than the read voltage RV1, and may output read data "0."

Referring to FIG. 3B, in a case where memory cells are read by a read voltage RV1' other than a read voltage RV1 requested by the controller 200 due to noise or the like by environmental influences of the controller 200 and the nonvolatile memory device 300, cells may be read as unerased cells even though they are erased cells. For example, the memory cells positioned in a region 302 may be read as "0" when read by the read voltage RV' even though they should be read as "1" when they are read by the requested read voltage RV1, and, in some cases, an error correction error (UECC) state may occur.

The erased memory cells in FIGS. 3A and 3B may be SLC memory cells. Therefore, normally erased memory cells may output "1" in response to the read voltage RV1. When erased memory cells are MLC memory cells, normally erased memory cells may output "11" in response to the read voltages RV11 to RV13 of FIG. 2B.

Figure 4A:
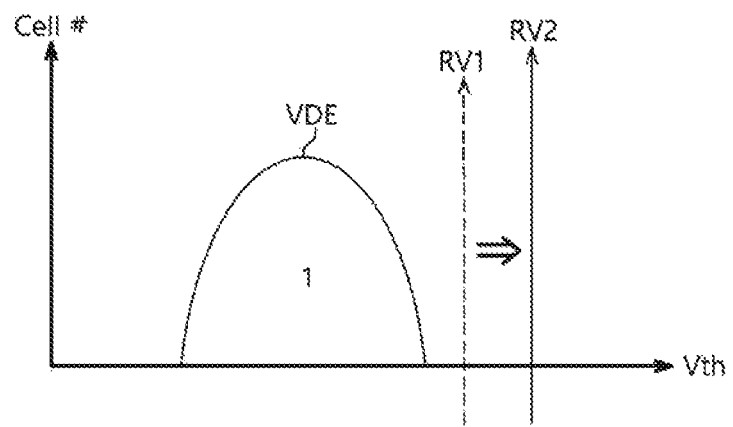
FIG. 4A is a diagram to assist explaining a method for determining whether SLC memory cells are erased or not, in accordance with an embodiment of the present disclosure.
Figure 4B:
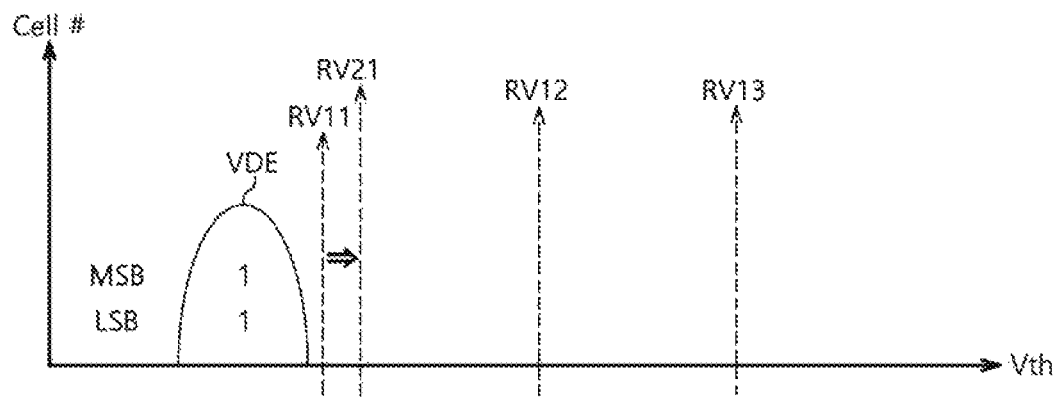
FIG. 4B is a diagram explaining a method for determining whether MLC memory cells are erased or not, in accordance with an embodiment of the present disclosure.

FIG. 4A is a diagram explaining a method for determining whether SLC memory cells are erased or not, in accordance with an embodiment of the present disclosure. FIG. 4B is a diagram explaining a method for determining whether MLC memory cells are erased or not, in accordance with an embodiment of the present disclosure.

Referring to FIG. 4A, erased SLC memory cells may form a threshold voltage distribution VDE as described above with reference to FIG. 3A. Some of the erased SLC memory cells may output "0" even though they should output "1," when they are applied with a first read voltage RV1.

In this case, in order for accurate determination of the erased memory cells, information that the memory cells are erased may be obtained from data obtained by applying a second read voltage RV2. That is, although "0" is read from erased SLC memory cells through applying the first read voltage RV1, "1" may be read through applying the second read voltage RV2.

The second read voltage RV2 may be a voltage higher than or equal to the first read voltage RV1.

The SLC memory cells that are determined to be erased may be coupled to a common word line.

The second read voltage RV2 may be set through a separate read command or a separate read voltage setting command when it is determined through the first read voltage RV1 that memory cells are not erased. However, it is to be noted that the embodiment is not limited thereto. When a read command is provided for applying the first read voltage RV1, the second read voltage RV2 may be set together.

Referring to FIG. 4B, erased MLC memory cells may form a threshold voltage distribution VDE. Some of the erased MLC memory cells may output "10" even though they should output "11," when they are applied with read voltages RV11 to RV13. In this case, in order for accurate determination of the erased memory cells, information that the memory cells are erased may be obtained from data obtained by applying a read voltage set including a second read voltage RV21. In other words, "11" may be read through applying the read voltage set including the second read voltage RV21.

The second read voltage RV21 may be a voltage higher than or equal to first read voltage RV11.

The MLC memory cells that are determined to be erased may be coupled to a common word line.

The second read voltage RV21 may be set through a separate read command or a separate read voltage setting command when it is determined through a read voltage set including the first read voltage RV11 that memory cells are not erased. However, it is to be noted that the embodiment is not limited thereto. When a read command is provided for applying the read voltage set including the first read voltage RV11, the second read voltage RV21 may be set together.

Referring again to FIG. 1, the data storage device 100 in accordance with the embodiment may include the nonvolatile memory device 300 which includes a plurality of memory cells and the controller 200 which is configured to determine whether memory cells are erased or not. When it is determined, based on first data read according to a read voltage set including a first read voltage, that memory cells are not erased, the controller 200 may determine, based on second data read according to a read voltage set including a second read voltage, whether memory cells are erased or not. The first and second read voltages may be read voltages of lowest levels among the read voltages included in the read voltage sets.

The controller 200 may determine that memory cells are not erased when the number of bits having a predetermined value in a first data, which is read from the memory cells, exceeds a first reference number. The controller 200 may also determine that memory cells are not erased when the number of bits having the predetermined value in a second data, which is read from the memory cells, exceeds a second reference number. The first reference number and the second reference number may be the same or different. Namely, by setting different references for determining whether memory cells are erased or not, it is possible to precisely determine whether the memory cells are erased or not.

The controller 200 of the data storage device 100 in accordance with the embodiment may perform an error correction operation for the first data when it is determined based on the first data that memory cells are not erased. When the error correction operation for the first data fails, the controller 200 may control the nonvolatile memory device 300 to read the second data, by applying the read voltage set including the second read voltage. The controller 200 may perform an error correction operation for the second data when it is determined based on the second data that memory cells are not erased.

FIG. 5 is a flow chart explaining a method for operating a data storage device in accordance with an embodiment of the present disclosure.

Referring to FIG. 5, the method for operating a data storage device in accordance with the embodiment may include a step S100 of obtaining first data by applying a read voltage set including a first read voltage to memory cells, steps S200 and S210 of determining whether the memory cells are erased or not based on the first data, a step S300 of obtaining second data by applying a read voltage set including a second read voltage to the memory cells when it is determined that the memory cells are not erased, and step S400 of determining whether the memory cell are erased or not based on the second data. The first and second read voltages may be read voltages of lowest levels among the read voltages included in the read voltage sets. The second read voltage may be a voltage of a level the same as or higher than the first read voltage.

In the method for operating a data storage device in accordance with the embodiment, the steps S200 and S210 of determining whether the memory cells are erased or not based on the first data may determine that the memory cells are not erased when the number of bits having a predetermined value in the first data exceeds a first reference number, and the step S400 of determining whether the memory cell are erased or not based on the second data may determine that the memory cells are not erased when the number of bits having the predetermined value in the second data exceeds a second reference number. The first reference number and the second reference number may be the same value or different values.

Figure 6:
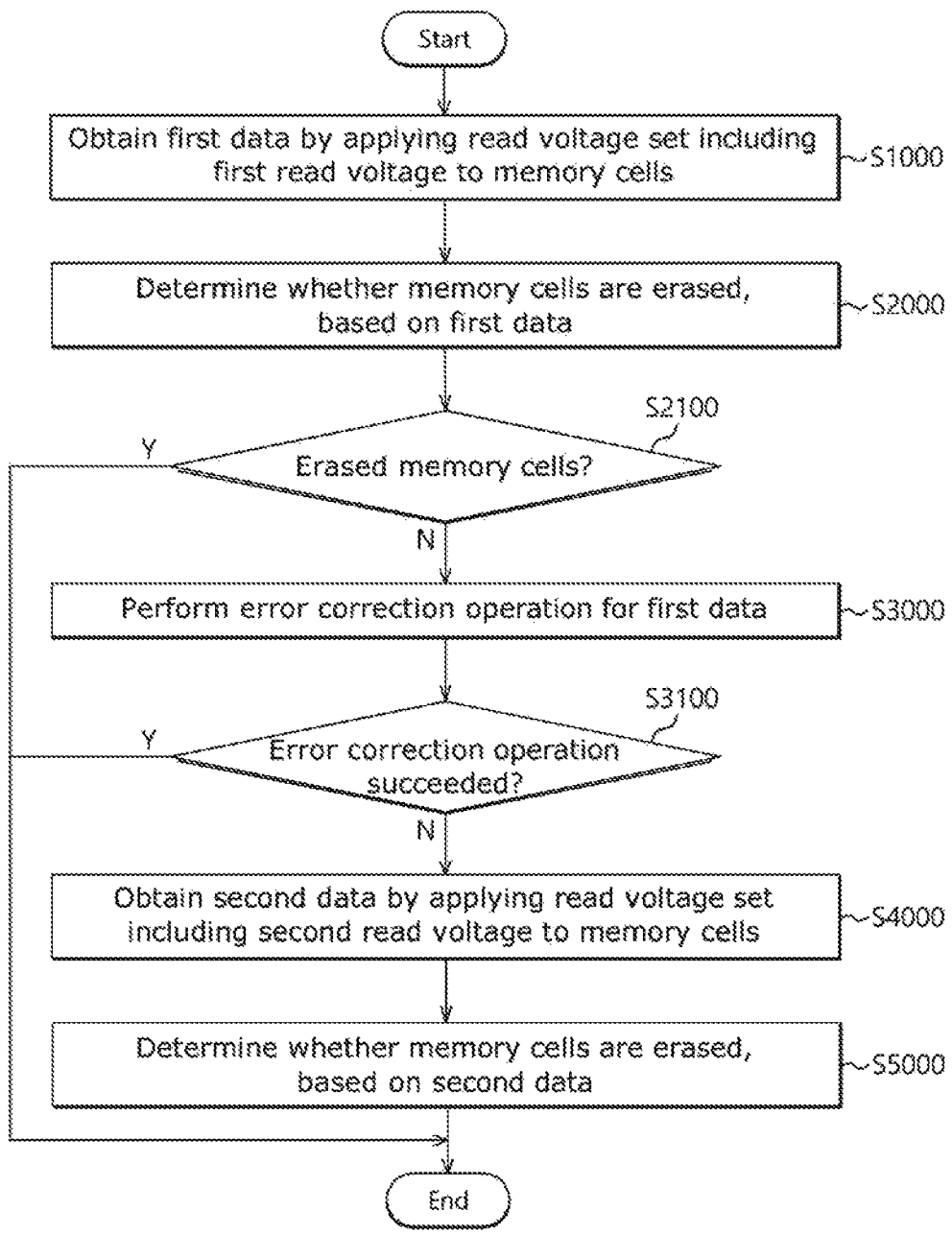
FIG. 6 is a flow chart explaining a method for operating a data storage device in accordance with an embodiment of the present disclosure.

FIG. 6 is a flow chart explaining a method for operating a data storage device in accordance with an embodiment of the present disclosure.

Referring to FIG. 6, the method for operating a data storage device in accordance with the embodiment may include steps S1000, S2000, and S2100 of determining whether memory cells are erased or not based on first data obtained by applying a read voltage set including a first read voltage to the memory cells, a step S3000 of performing an error correction operation for the first data when it is determined as a result of determination that the memory cells are not erased, steps S3100 and S4000 of obtaining second data by applying a read voltage set including a second read voltage to the memory cells when the error correction operation fails, and step S5000 of determining whether the memory cells are erased or not based on the second data. The first and second read voltages may be read voltages of lowest levels among the read voltages included in the read voltage sets.

Figure 7:
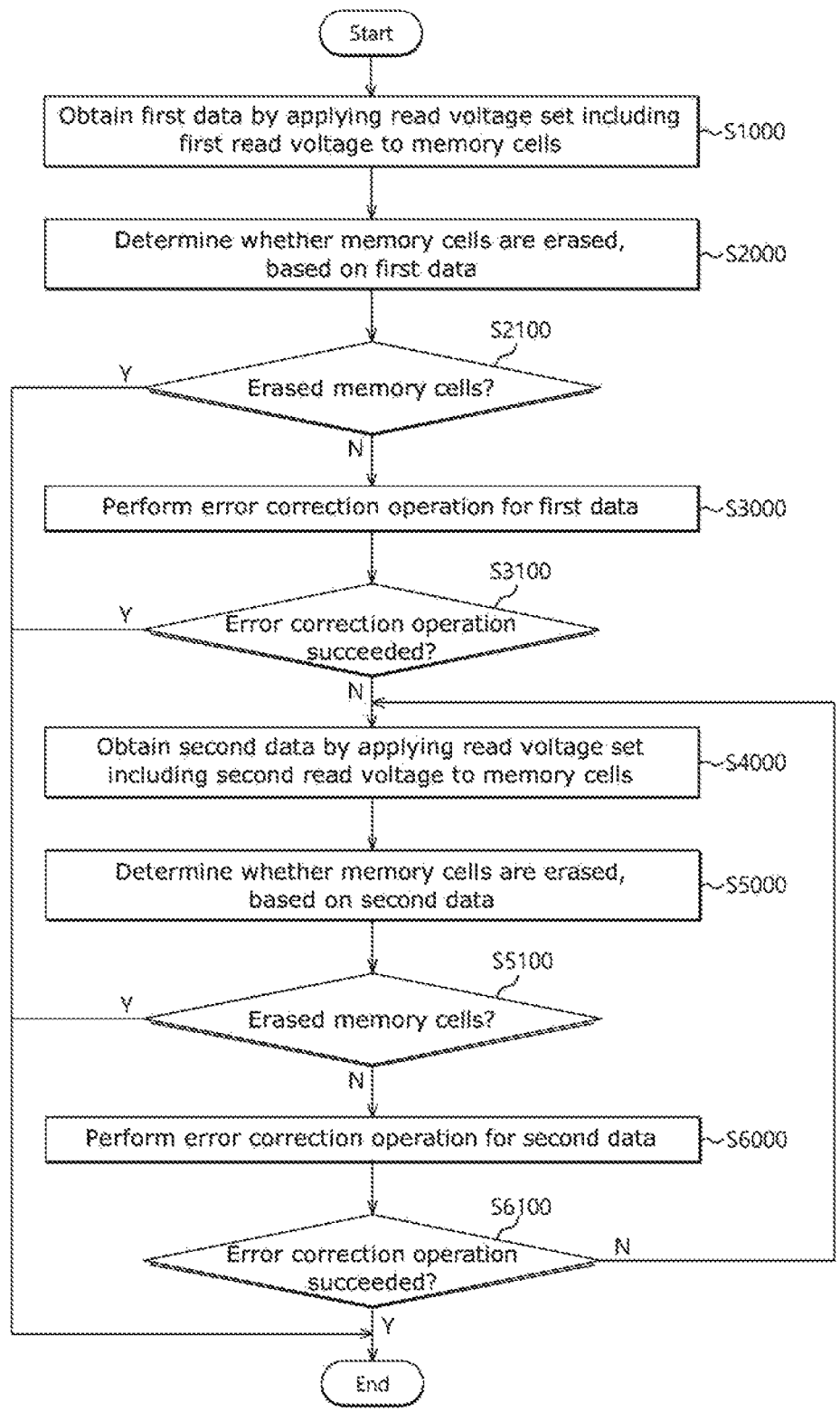
FIG. 7 is a flow chart explaining a method for operating a data storage device in accordance with an embodiment of the present disclosure.

FIG. 7 is a flow chart explaining a method for operating a data storage device in accordance with an embodiment of the present disclosure.

Referring to FIG. 7, the method for operating a data storage device in accordance with the embodiment may further include steps S6000 and S6100 of performing an error correction operation for the second data when it is determined, based on the second data, that the memory cells are not erased.

In the method for operating a data storage device in accordance with the embodiment, the step S2000 of determining, based on the first data, whether the memory cells are erased or not may determine that the memory cells are not erased when the number of bits having a predetermined value among the first data exceeds a first reference number, and the step S5000 of determining, based on the second data, whether the memory cell are erased or not may determine that the memory cells are not erased when the number of bits having the predetermined value among the second data exceeds a second reference number. The first reference number and the second reference number may be the same value or different values.

Figure 8:
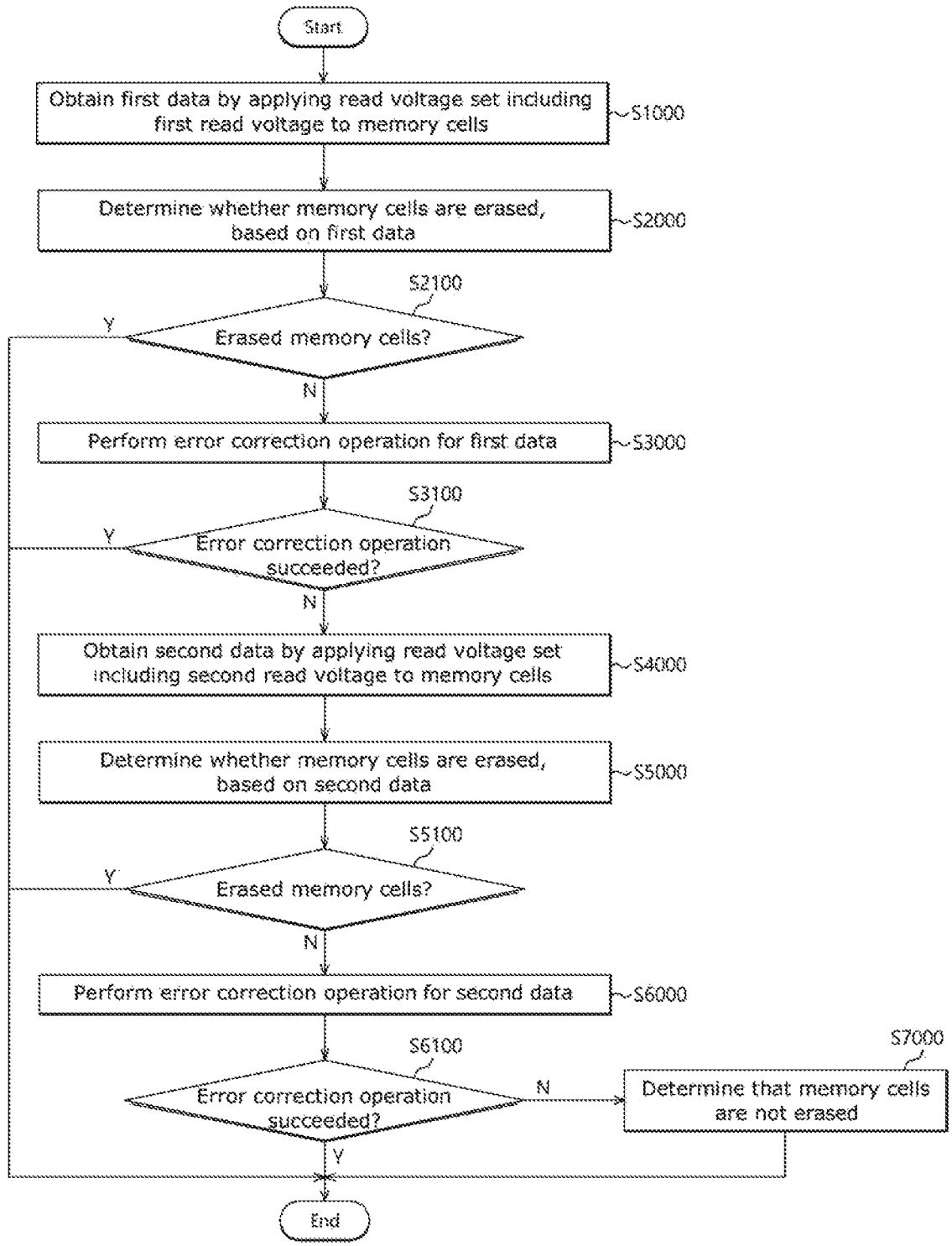
FIG. 8 is a flow chart explaining a method for operating a data storage device in accordance with an embodiment of the present disclosure.

FIG. 8 is a flow chart explaining a method for operating a data storage device in accordance with an embodiment of the present disclosure.

Referring to FIG. 8, the method for operating a data storage device in accordance with an embodiment may further include step S7000 of determining that the memory cells are not erased when the error correction operation for the second data fails. The second read voltage may be a voltage higher than or equal to the first read voltage. That is, if an error correction operation fails even though it is performed twice, it may be determined that corresponding memory cells are not erased. For example, when 1-bit data is stored in each memory cell, it may be determined that the corresponding memory cells are not written with "1," and, when 2-bit data is stored in each memory cell, it may be determined that the corresponding memory cells are not written with "11."

Figure 9:
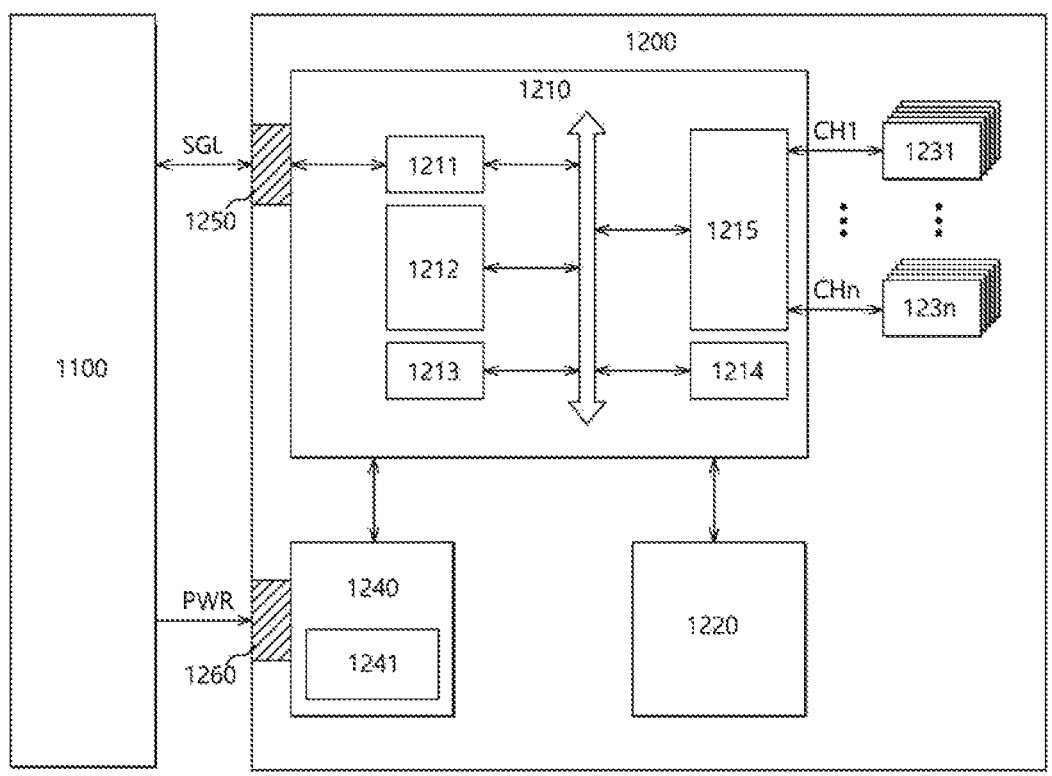
FIG. 9 is a diagram illustrating an example of a data processing system including a solid state drive (SSD) in accordance with an embodiment of the present disclosure.

FIG. 9 is a diagram illustrating an example of a data processing system including a solid state drive (SSD) in accordance with an embodiment of the present disclosure. Referring to FIG. 9, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process a signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
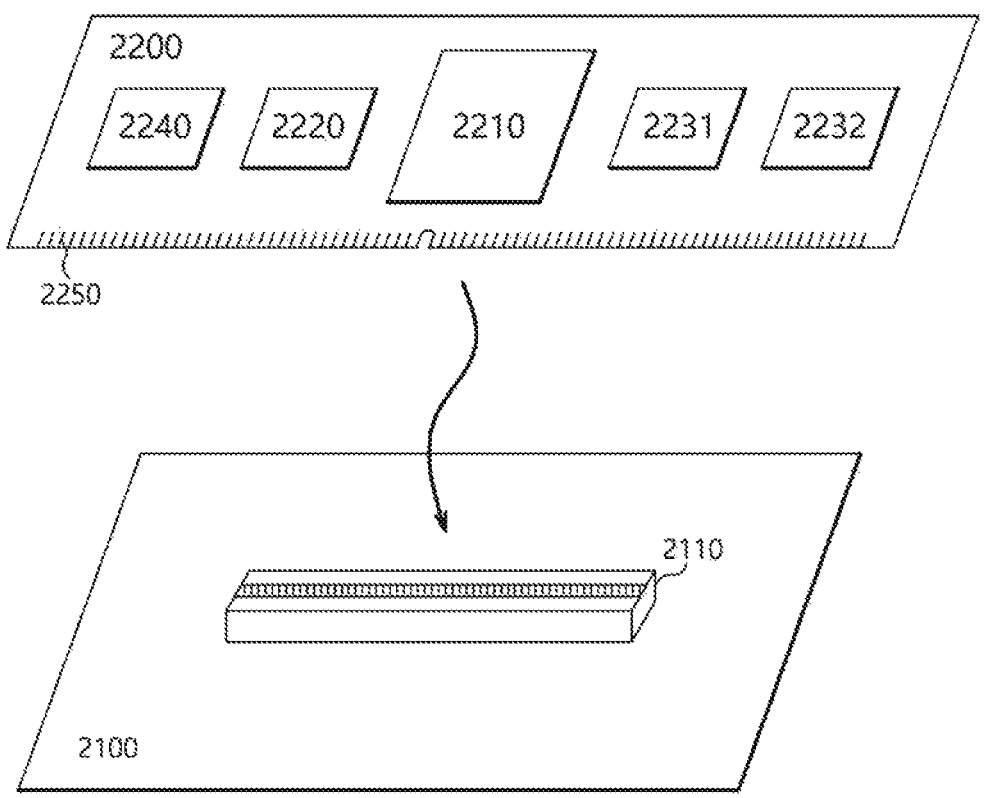
FIG. 10 is a diagram illustrating an example of a data processing system including a data storage device in accordance with an embodiment of the present disclosure.

FIG. 10 is a diagram illustrating an example of a data processing system including a data storage device in accordance with an embodiment of the present disclosure. Referring to FIG. 10, a data processing system 2000 may include a host device 2100 and a data storage device 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 11:
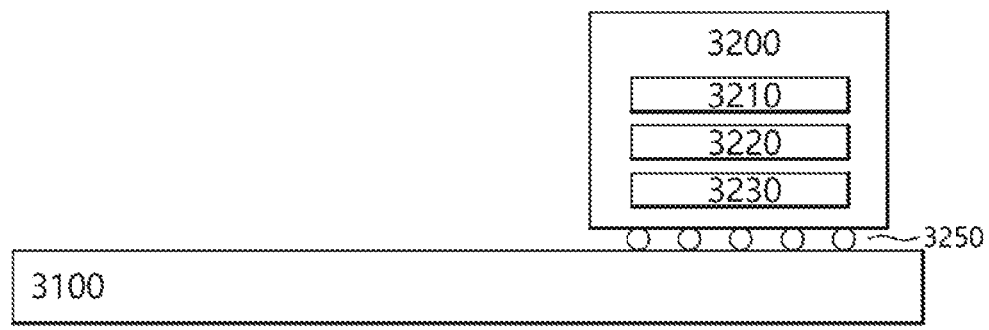
FIG. 11 is a diagram illustrating an example of a data processing system including a data storage device in accordance with an embodiment of the present disclosure.

FIG. 11 is a diagram illustrating an example of a data processing system including a data storage device in accordance with an embodiment of the present disclosure. Referring to FIG. 11, a data processing system 3000 may include a host device 3100 and a data storage device 3200.

The host device 3100 may be configured in the form of a board such as a printed circuit board. Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as a storage medium of the data storage device 3200.

Figure 12:
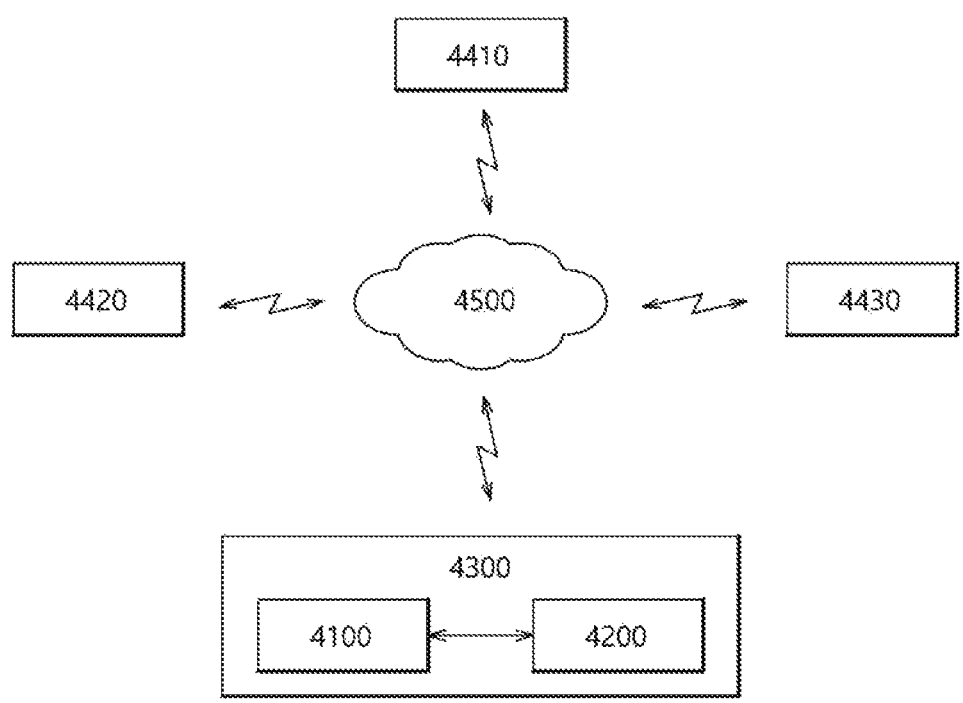
FIG. 12 is a diagram illustrating an example of a network system including a data storage device in accordance with an embodiment of the present disclosure.

FIG. 12 is a diagram illustrating an example of a network system including a data storage device in accordance with an embodiment of the present disclosure. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 100 shown in FIG. 1, the SSD 1200 shown in FIG. 9, the data storage device 2200 shown in FIG. 10 or the data storage device 3200 shown in FIG. 11.

Figure 13:
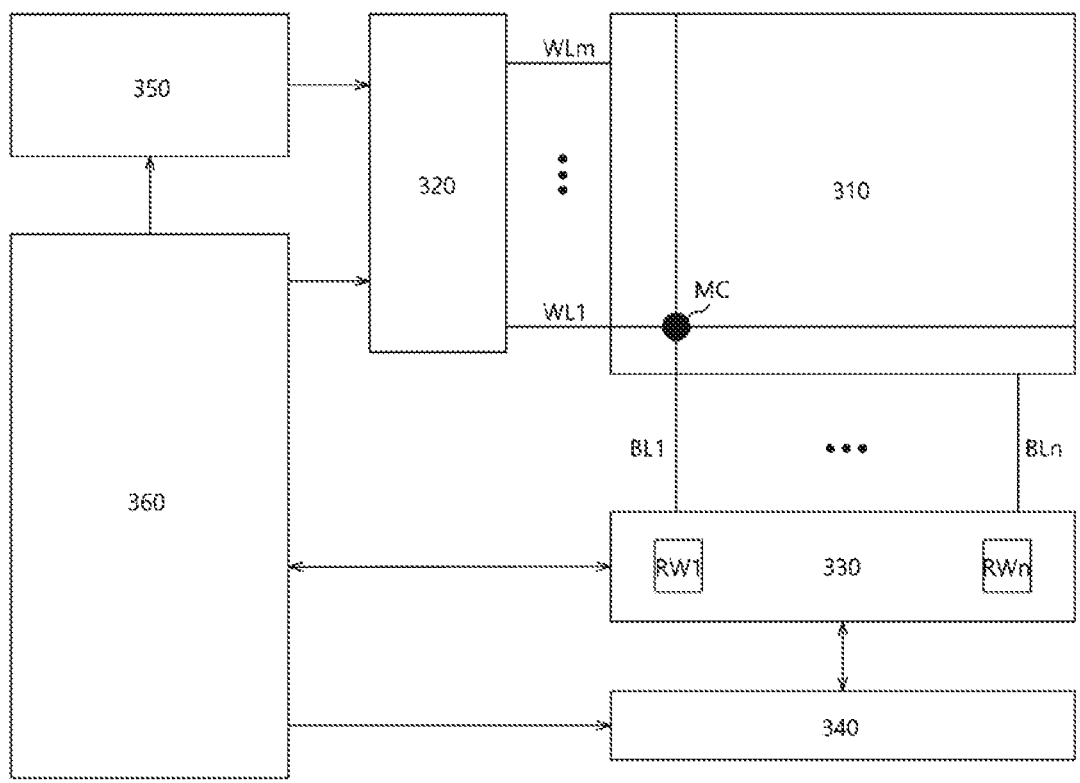
FIG. 13 is a block diagram illustrating an example of a data storage device including a nonvolatile memory device, in accordance with an embodiment of the present disclosure.

FIG. 13 is a block diagram illustrating an example of a data storage device including a nonvolatile memory device, in accordance with an embodiment of the present disclosure. Referring to FIG. 13, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier depending on an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control the read, write and erase operations of the nonvolatile memory device 300.

The descriptions for the above-described device may be applied to the methods in accordance with the embodiments of the present disclosure. Therefore, descriptions the same as the descriptions for the above-described device were omitted in the methods.

While various embodiments have been described above, it will be understood to those skilled in the art that the embodiments described are examples only. Accordingly, the data storage device and the operating method thereof described herein should not be limited based on the described embodiments.

What is claimed is:
1. A data storage device comprising:
a nonvolatile memory device including a plurality of memory cells; and a controller suitable for, when it is determined that the memory cells are not erased based on first data, determining whether the memory cells are erased or not based on second data, wherein the nonvolatile memory device reads the first data from the memory cells by applying a read voltage set, in which a first read voltage is included, to the memory cells, adjusts the read voltage set by replacing the first read voltage with a second read voltage, and reads the second data from the memory cells by applying an adjusted read voltage set to the memory cells, and wherein the first read voltage has a lowest voltage level in the read voltage set and the second read voltage has a lowest voltage level in the adjusted read voltage set.

2. The data storage device according to claim 1, wherein the second read voltage is a voltage of a level higher than the first read voltage by a predetermined voltage.

3. The data storage device according to claim 1, wherein the second read voltage is a voltage of a level the same as the first read voltage.

4. The data storage device according to claim 1, wherein the memory cells are coupled to a common word line.

5. The data storage device according to claim 1, wherein the controller determines that the memory cells are not erased, when a number of bits having a predetermined value among the first data exceeds a first reference number.

6. The data storage device according to claim 5,
wherein the controller determines that the memory cells are not erased, when a number of bits having a predetermined value among the second data exceeds a second reference number, and
wherein the first reference number and the second reference number are different.

7. The data storage device according to claim 1, wherein the controller performs an error correction operation for the first data, when it is determined based on the first data that the memory cells are not erased.

8. The data storage device according to claim 7, wherein the controller controls, when the error correction operation for the first data fails, the nonvolatile memory device to read the second data and performs an error correction operation for the second data, when it is determined based on the second data that the memory cells are not erased.

9. A method for operating a data storage device, comprising:
obtaining first data by applying a read voltage set, in which a first read voltage is included, to memory cells;
determining whether the memory cells are erased or not based on the first data;
adjusting the read voltage set by replacing the first read voltage with a second read voltage when it is determined that the memory cells are not erased;
obtaining second data by applying an adjusted read voltage set to the memory cells after the adjusting of the read voltage set; and
determining whether the memory cells are erased or not based on the second data after the obtaining of the second data,
wherein the first read voltage has a lowest voltage level in the read voltage set and the second read voltage has a lowest voltage level in the adjusted read voltage set.

10. The method according to claim 9, wherein the second read voltage is a voltage of a level higher than the first read voltage by a predetermined voltage.

11. The method according to claim 9, wherein the second read voltage is a voltage of a level the same as the first read voltage.

12. The method according to claim 9, wherein the determining of whether the memory cells are erased or not, based on the first data, determines that the memory cells are not erased, when a number of bits having a predetermined value among the first data exceeds a first reference number.

13. The method according to claim 12,
wherein the determining of whether the memory cells are erased or not, based on the second data, determines that the memory cells are not erased, when a number of bits having a predetermined value among the second data exceeds a second reference number, and
wherein the first reference number and the second reference number are different.

14. The method according to claim 9, wherein the memory cells are coupled to a common word line.

15. A method for operating a data storage device, comprising:
determining whether memory cells are erased or not based on first data obtained by applying a read voltage set, in which a first read voltage is included, to the memory cells;
performing an error correction operation for the first data, when it is determined as a result of the determining that the memory cells are not erased;
adjusting the read voltage set by replacing the first read voltage with a second read voltage when the error correction operation fails;
obtaining second data by applying an adjusted read voltage set to the memory cells after the adjusting of the read voltage set; and
determining whether the memory cells are erased or not based on the second data after the obtaining of the second data,
wherein the first read voltage has a lowest voltage level in the read voltage set and the second read voltage has a lowest voltage level in the adjusted read voltage set.

16. The method according to claim 15, further comprising:
performing an error correction operation for the second data, when it is determined, based on the second data, that the memory cells are not erased.

17. The method according to claim 15, wherein the determining of whether the memory cells are erased or not, based on the first data, determines that the memory cells are not erased, when a number of bits having a predetermined value among the first data exceeds a first reference number.

18. The method according to claim 17,
wherein the determining of whether the memory cells are erased or not, based on the second data, determines that the memory cells are not erased, when a number of bits having a predetermined value among the second data exceeds a second reference number, and
wherein the first reference number and the second reference number are different.

19. The method according to claim 16, further comprising:
determining that the memory cells are not erased, when the error correction operation for the second data fails.

20. The method according to claim 15, wherein the second read voltage is a voltage of a level higher than the first read voltage by a predetermined voltage.

* * * * *